(12) United States Patent
Chen et al.

(10) Patent No.: US 9,159,791 B2
(45) Date of Patent: Oct. 13, 2015

(54) SEMICONDUCTOR DEVICE COMPRISING A CONDUCTIVE REGION

(75) Inventors: Wei-Lin Chen, Changhua County (TW); Ke-Feng Lin, Taipei (TW); Chih-Chien Chang, Hsinchu (TW); Chih-Chung Wang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 202 days.

(21) Appl. No.: 13/489,467

(22) Filed: Jun. 6, 2012

(65) Prior Publication Data

US 2013/0328123 A1 Dec. 12, 2013

(51) Int. Cl.
| | |
|---|---|
| H01L 29/66 | (2006.01) |
| H01L 29/08 | (2006.01) |
| H01L 29/417 | (2006.01) |
| H01L 29/78 | (2006.01) |
| H01L 29/06 | (2006.01) |
| H01L 21/225 | (2006.01) |
| H01L 21/265 | (2006.01) |
| H01L 29/45 | (2006.01) |

(52) U.S. Cl.
CPC ........ *H01L 29/0878* (2013.01); *H01L 29/0653* (2013.01); *H01L 29/0873* (2013.01); *H01L 29/41766* (2013.01); *H01L 29/66719* (2013.01); *H01L 29/7809* (2013.01); *H01L 21/2255* (2013.01); *H01L 21/2257* (2013.01); *H01L 21/26586* (2013.01); *H01L 29/456* (2013.01)

(58) Field of Classification Search
CPC ............ H01L 27/2454; H01L 29/0843; H01L 29/0847; H01L 29/0852; H01L 29/0873; H01L 29/0878; H01L 29/0882; H01L 29/0886

USPC .................. 257/244, 288, 329, 335, E21.417, 257/E29.256
See application file for complete search history.

(56) References Cited

U.S. PATENT DOCUMENTS

| | | | |
|---|---|---|---|
| 4,344,081 | A | 8/1982 | Pao |
| 4,396,999 | A | 8/1983 | Malaviya |
| 4,893,160 | A | 1/1990 | Blanchard |
| 4,918,333 | A | 4/1990 | Anderson |
| 4,958,089 | A | 9/1990 | Fitzpatrick |
| 5,040,045 | A | 8/1991 | McArthur |
| 5,268,589 | A | 12/1993 | Dathe |
| 5,296,393 | A | 3/1994 | Smayling |

(Continued)

OTHER PUBLICATIONS

Kao, Title: Semiconductor Device and Method of Fabricating the Same, pending U.S. Appl. No. 13/369,296, filed Feb. 9, 2012.

*Primary Examiner* — Jay C Kim
(74) *Attorney, Agent, or Firm* — Winston Hsu; Scott Margo (57) ABSTRACT

A semiconductor device includes a semiconductor substrate, a buried layer disposed in the semiconductor substrate; a deep well disposed in the semiconductor substrate; a first doped region disposed in the deep well, wherein the first doped region contacts the buried layer; a conductive region having the first conductivity type surrounding and being adjacent to the first doped region, wherein the conductive region has a concentration higher than the first doped region; a first heavily doped region disposed in the first doped region; a well having a second conductivity type disposed in the deep well; a second heavily doped region disposed in the well; a gate disposed on the semiconductor substrate between the first heavily doped region and the second heavily doped region; and a first trench structure and a second trench structure, wherein a depth of the second trench structure is substantially deeper than a depth of the buried layer.

7 Claims, 10 Drawing Sheets

(56) References Cited

U.S. PATENT DOCUMENTS

| | | | | |
|---|---|---|---|---|
| 5,326,711 | A | 7/1994 | Malhi | |
| 5,346,835 | A | 9/1994 | Malhi | |
| 5,430,316 | A | 7/1995 | Contiero | |
| 5,436,486 | A | 7/1995 | Fujishima | |
| 5,534,721 | A | 7/1996 | Shibib | |
| 5,811,850 | A | 9/1998 | Smayling | |
| 5,950,090 | A | 9/1999 | Chen | |
| 5,998,301 | A | 12/1999 | Pham | |
| 6,066,884 | A | 5/2000 | Krutsick | |
| 6,144,538 | A | 11/2000 | Chao | |
| 6,165,846 | A | 12/2000 | Carns | |
| 6,245,689 | B1 | 6/2001 | Hao | |
| 6,277,675 | B1 | 8/2001 | Tung | |
| 6,277,757 | B1 | 8/2001 | Lin | |
| 6,297,108 | B1 | 10/2001 | Chu | |
| 6,306,700 | B1 | 10/2001 | Yang | |
| 6,326,283 | B1 | 12/2001 | Liang | |
| 6,353,247 | B1 | 3/2002 | Pan | |
| 6,388,292 | B1 | 5/2002 | Lin | |
| 6,400,003 | B1 | 6/2002 | Huang | |
| 6,424,005 | B1 | 7/2002 | Tsai | |
| 6,514,830 | B1 | 2/2003 | Fang | |
| 6,521,538 | B2 | 2/2003 | Soga | |
| 6,614,089 | B2 | 9/2003 | Nakamura | |
| 6,713,794 | B2 | 3/2004 | Suzuki | |
| 6,762,098 | B2 | 7/2004 | Hshieh | |
| 6,764,890 | B1 | 7/2004 | Xu | |
| 6,784,060 | B2 | 8/2004 | Ryoo | |
| 6,784,490 | B1 | 8/2004 | Inoue | |
| 6,819,184 | B2 | 11/2004 | Pengelly | |
| 6,822,296 | B2 | 11/2004 | Wang | |
| 6,825,531 | B1 | 11/2004 | Mallikarjunaswamy | |
| 6,846,729 | B2 | 1/2005 | Andoh | |
| 6,855,581 | B2 | 2/2005 | Roh | |
| 6,869,848 | B2 | 3/2005 | Kwak | |
| 6,894,349 | B2 | 5/2005 | Beasom | |
| 6,958,515 | B2 | 10/2005 | Hower | |
| 7,015,116 | B1 | 3/2006 | Lo | |
| 7,023,050 | B2 | 4/2006 | Salama | |
| 7,037,788 | B2 | 5/2006 | Ito | |
| 7,075,575 | B2 | 7/2006 | Hynecek | |
| 7,091,079 | B2 | 8/2006 | Chen | |
| 7,148,540 | B2 | 12/2006 | Shibib | |
| 7,214,591 | B2 | 5/2007 | Hsu | |
| 7,309,636 | B2 | 12/2007 | Chen | |
| 7,323,740 | B2 | 1/2008 | Park | |
| 7,358,567 | B2 | 4/2008 | Hsu | |
| 7,427,552 | B2 | 9/2008 | Jin | |
| 7,535,057 | B2 * | 5/2009 | Yang | 257/335 |
| 7,541,247 | B2 * | 6/2009 | Voldman | 438/294 |
| 7,667,270 | B2 * | 2/2010 | Moens et al. | 257/343 |
| 7,791,161 | B2 * | 9/2010 | Zhu et al. | 257/505 |
| 7,868,394 | B2 | 1/2011 | Kao | |
| 2003/0022460 | A1 | 1/2003 | Park | |
| 2004/0018698 | A1 | 1/2004 | Schmidt | |
| 2004/0070050 | A1 | 4/2004 | Chi | |
| 2005/0227448 | A1 | 10/2005 | Chen | |
| 2005/0258496 | A1 | 11/2005 | Tsuchiko | |
| 2006/0035437 | A1 | 2/2006 | Mitsuhira | |
| 2006/0261407 | A1 | 11/2006 | Blanchard | |
| 2006/0270134 | A1 | 11/2006 | Lee | |
| 2006/0270171 | A1 | 11/2006 | Chen | |
| 2007/0041227 | A1 | 2/2007 | Hall | |
| 2007/0082440 | A1 | 4/2007 | Shiratake | |
| 2007/0132033 | A1 | 6/2007 | Wu | |
| 2007/0273001 | A1 | 11/2007 | Chen | |
| 2008/0160697 | A1 | 7/2008 | Kao | |
| 2008/0160706 | A1 | 7/2008 | Jung | |
| 2008/0185629 | A1 | 8/2008 | Nakano | |
| 2008/0296655 | A1 | 12/2008 | Lin | |
| 2009/0108348 | A1 | 4/2009 | Yang | |
| 2009/0111252 | A1 | 4/2009 | Huang | |
| 2009/0159966 | A1 | 6/2009 | Huang | |
| 2009/0278208 | A1 | 11/2009 | Chang | |
| 2009/0294865 | A1 | 12/2009 | Tang | |
| 2010/0006937 | A1 | 1/2010 | Lee | |
| 2010/0032758 | A1 | 2/2010 | Wang | |
| 2010/0096702 | A1 | 4/2010 | Chen | |
| 2010/0148250 | A1 | 6/2010 | Lin | |
| 2010/0213517 | A1 | 8/2010 | Sonsky | |
| 2011/0057263 | A1 | 3/2011 | Tang | |

* cited by examiner

SEMICONDUCTOR DEVICE COMPRISING A CONDUCTIVE REGION

BACKGROUND OF THE INVENTION

1. Field of the Invention

The present invention relates to the field of semiconductor devices, and more particularly, to a semiconductor device having trench structures and a method for fabricating the same.

2. Description of the Prior Art

Double-diffused metal-oxide-semiconductor (DMOS) transistor devices can be classified into two categories; the first one comprises the lateral double-diffused MOS transistors and the second one comprises the vertical double-diffused MOS transistors. Thanks to the advantages of having a high operational bandwidth and a high operational efficiency, the DMOS transistor devices are widely used in high operational voltage environments, such as CPU power supplies, power management systems, AC/DC converters, and high-power or high frequency (HF) band power amplifiers.

Generally, each LDMOS transistor includes a substrate having a first conductivity type, such as P-type; a pair of source and drain regions having a second conductivity type, such as N-type, being disposed in the substrate, wherein the source is embedded in a P-type well; and a gate structure disposed on a part of a field oxide layer. When the transistor is switched on, the current can flow from the source or the drain side to the other side through a lateral diffused area which has a low dopant concentration and a large area. As a result, this lateral diffused area can buffer the high voltage signals between the source region and the drain region and improve the breakdown voltage ($V_{bd}$) of the transistor.

With the trend of miniaturization of the electronic products, the conventional LDMOS transistors have already reached their limits, due to the relatively large cell pitch in the transistor. Therefore, how to reduce the occupied area of DMOS transistor devices in a semiconductor substrate without adversely affecting their performance is an important issue in this field.

SUMMARY OF THE INVENTION

One objective of the present invention is to provide a semiconductor device including trench structures and a method for fabricating the semiconductor device in order to save the occupied area of DMOS transistor devices in a semiconductor substrate.

According to one embodiment of the invention, a semiconductor device is provided, which includes: a semiconductor substrate; a buried layer disposed in the semiconductor substrate; a deep well having a first conductivity type being disposed in the semiconductor substrate, wherein a deep well is disposed on the buried layer; a first doped region having a first conductivity type being disposed in the deep well, wherein the first doped region contacts the buried layer; a conductive region having the first conductivity type being adjacent to the first doped region, wherein the conductive region has a doping concentration higher than the first doped region; a first heavily doped region having a first conductivity type disposed in the first doped region; a well having a second conductivity type disposed in the deep well; a second heavily doped region having a first conductivity type and disposed in the well; a gate disposed on the semiconductor substrate between the first heavily doped region and the second heavily doped region; a first trench structure disposed in the semiconductor substrate at one side of the gate, wherein the first trench structure contacts the buried layer; and a second trench structure disposed in the semiconductor substrate at the other side of the gate opposite to the first trench structure, wherein a depth of the second trench structure is substantially deeper than a depth of the buried layer.

According to another embodiment, the invention provides a semiconductor device including the following components: a semiconductor substrate; a buried layer disposed in the semiconductor substrate; a deep well having a first conductivity type disposed in the semiconductor substrate, wherein the deep well is disposed on the buried layer; a first doped region having a first conductivity type disposed in the deep well, wherein the first doped region contacts the buried layer; a conductive region comprising metal being adjacent to the first doped region; a first heavily doped region having a first conductivity type and disposed in the first doped region; a well having a second conductivity type disposed in the deep well; a second heavily doped region having a first conductivity type disposed in the well; a gate disposed on the semiconductor substrate between the first heavily doped region and the second heavily doped region; a first trench structure disposed in the semiconductor substrate at one side of the gate, wherein the first trench structure contacts the buried layer; and a second trench structure disposed in the semiconductor substrate at the other side of the gate opposite to the first trench structure, wherein a depth of the second trench structure is substantially deeper than a depth of the buried layer.

According to still another embodiment, the present invention provides a method for fabricating a semiconductor device, which includes the following processes. A semiconductor substrate is provided; a buried layer in the semiconductor substrate is formed; a deep well having a first conductivity type is formed in the semiconductor substrate, wherein the deep well is disposed on the buried layer; an opening is formed in the deep well, wherein portion of the buried layer is exposed from the opening; a conductive region is formed on the sidewall of the opening; a first doped region having the first conductivity type fills up the opening; a first trench structure is formed in the deep well, wherein the first trench structure extends into the buried layer; and a second trench structure is formed in the semiconductor substrate, wherein a depth of the second trench structure is substantially larger than a depth of the buried layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
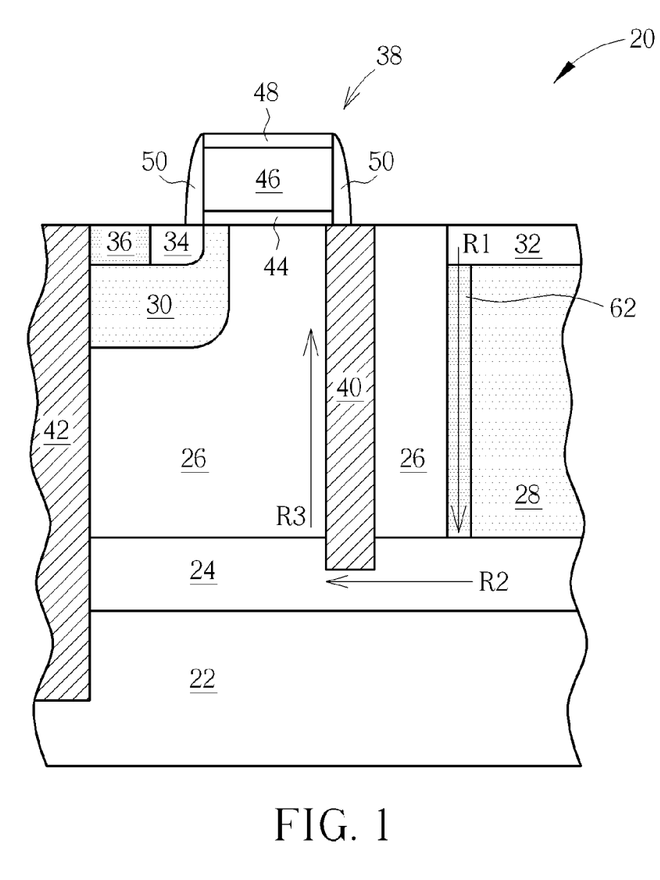
FIG. 1 is a schematic diagram illustrating a semiconductor device according to a preferred exemplary embodiment of the present invention.
Figure 2:
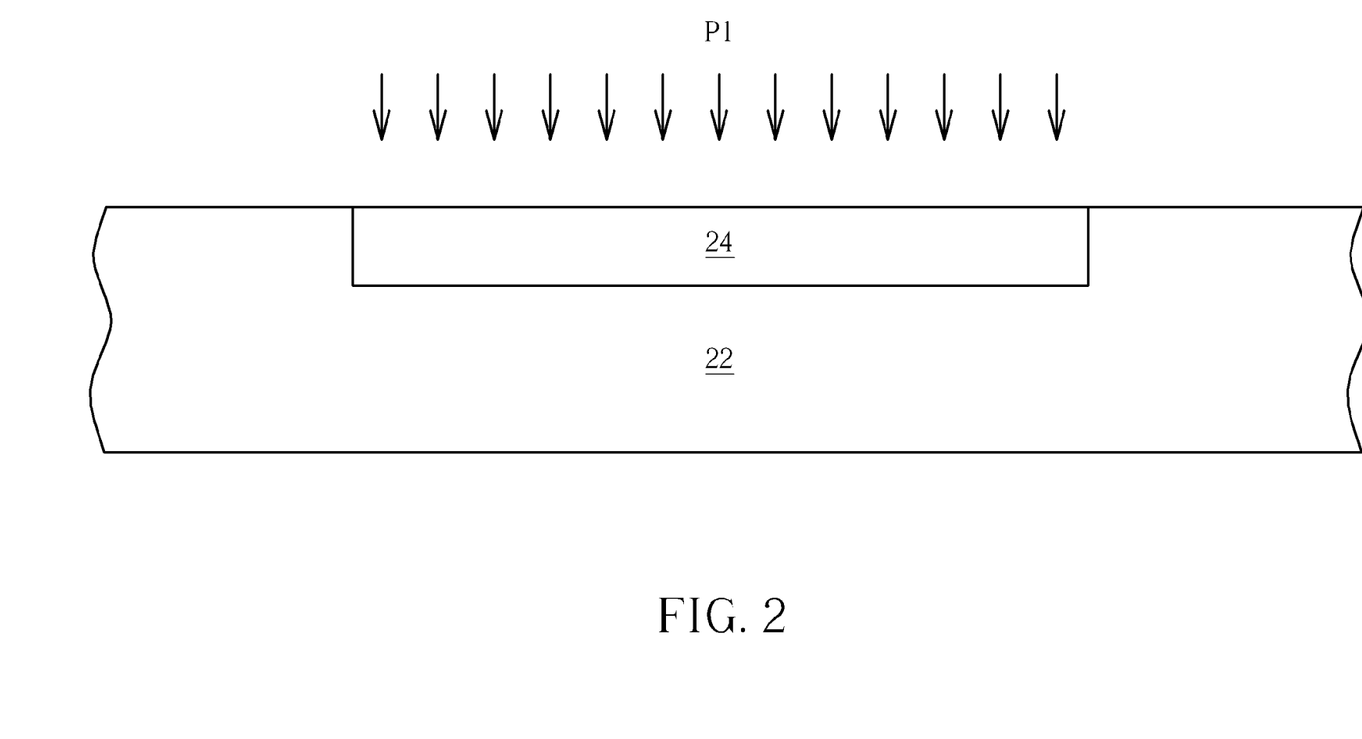
FIG. 2 through FIG. 10 illustrate a method for fabricating a semiconductor device according to preferred exemplary embodiments of the present invention.

The present invention provides a semiconductor device. Please refer to FIG. 2, which is a schematic diagram illustrating a semiconductor device according to a preferred exemplary embodiment of the present invention. As shown in FIG. 2, a semiconductor device 20 includes a semiconductor substrate 22, a buried layer 24, a deep well 26, a first doped region 28, a well 30, a first heavily doped region 32, a second heavily doped region 34, a third heavily doped region 36, a gate 38, a first trench structure 40 and a second trench structure 42. The semiconductor substrate 22 may be a substrate composed of gallium arsenide (GaAs), silicon on insulator (SOI) layer, epitaxial layer, SiGe layer or other semiconductor materials. The buried layer 24 having a first conductivity type is disposed in the semiconductor substrate 22 for insulation purposes, or, for example, to stop the current signal transferring into the semiconductor substrate 22 and avoid leakage, but not limited thereto. The deep well 26 having a first conductivity type is disposed in the semiconductor substrate 22 and is also disposed on the buried layer 24. The semiconductor substrate 22 could further include an epitaxial layer (not shown) so that the deep well 26 is embedded in the epitaxial layer, for example, the deep well 26 is embedded in an epitaxial layer having a thickness around 5 micrometers (μm).

The well 30 having a second conductivity type and the first doped region 28 having a first conductivity type are both disposed in the deep well 26, furthermore, the well 30 preferably does not contact the buried layer 24, but not limited thereto. In addition, the top surface and the bottom surface of the first doped region 28 may respectively contact the first heavily doped region 32 and the buried layer 24. Furthermore, a conductive region 62 is disposed between the deep well 26 and the first doped region 28, and preferably surrounds and is adjacent to the first doped region 28. It is worth noting that, in the present invention, since the conductive region 62 has a resistivity lower than the adjacent deep well 26 and the first doped region 28, the conductive region 62 can therefore serve as a path to let carriers flow through. According to different embodiments, the conductive region 62 may comprise dopants with the first conductivity type, metal silicide components or metal, but is not limited thereto. In addition, there may be a concentration gradient, such as dopant concentration gradient or a metal silicide concentration gradient, within the conductive region 62 wherein the concentration decreases progressively from an interface between the conductive region 62 and the first doped region 28 towards an interface between the conductive region 62 and the deep well 26. The first conductivity type could be n-type or p-type, and the second conductivity type is the other one. In the following paragraphs, the first and the second conductivity type can be deemed as an N-type and a P-type, respectively.

Both of the first heavily doped region 32 and the second heavily doped region 34 have the first conductivity type. The first heavily doped region 32 is disposed in the first doped region 28, and the second heavily doped region 34 is disposed in the well 30. In this exemplary embodiment, the first heavily doped region 32 could be the drain, and the second heavily doped region 34 could be the source. The third heavily doped region 36 disposed in the well 30 has the same conductivity type as the well 30, and the third heavily doped region 36 is used for adjusting the electric potential of the well 30. The gate 38 is disposed on the semiconductor substrate 22 between the first heavily doped region 32 and the second heavily doped region 34. The gate 38 includes a gate dielectric layer 44, a gate conductive layer 46 disposed on the gate dielectric layer 44, a cap layer 48 disposed on the gate conductive layer 46, and a spacer 50. As the gate 38 could comprise any suitable conductive material, like polysilicon, metal silicide or metal. Since the material and fabrication processes for the gate 38 are well-known to those skilled in the art, the details are omitted herein for brevity. Moreover, a part of the well 30 is under the gate 38.

The first trench structure 40 is disposed in the semiconductor substrate 22 at one side of the gate 38, between the first heavily doped region 32 and the second heavily doped region 34, more clearly, the first trench structure 40 is disposed between the first doped region 28 and the well 30 in the deep well region 26. The first trench structure 40 at least contacts the buried layer 24, and preferably extends into the buried layer 24 without penetrating the buried layer 24. The second trench structure 42 is disposed in the semiconductor substrate 22 at the other side of the gate 38 opposite to the first trench structure 40. The first trench structure 40 and the second trench structure 42 could be made of insulating material, and the second trench structure 42 may insulate the semiconductor device 20 from the other semiconductor device (not shown) disposed in the semiconductor substrate 22. Since the composition and fabrication processes of the trench structures 40 and 42 are well-know to those skilled in the art, the detailed description of which is therefore omitted for the sake of clarity. Additionally, the first trench structure 40 and the second trench structure 42 may be formed separately or, in another case, formed simultaneously by giving them with different opening size. As a result, a width of the first trench structure 40 is substantially smaller than that of the second trench structure 42. The depth of the second trench structure 42 is substantially larger than a depth of the buried layer 24. In other words, the bottom side of the second trench structure 42 is under the bottom side of the buried layer 24 and, preferably, deeper than the buried layer 24.

The present invention provides a semiconductor device 20 including features such as the first trench structure 40 and the conductive region 62. The first trench structure 40 can extend the path of carrier flow and the conductive region can lower the overall on-resistance ($R_{on}$) in the semiconductor device 20. This structure can be applied in various high-voltage devices, such as a vertical double-diffused metal-oxide-semiconductor (VDMOS) transistor device. As the semiconductor device 20 is turned on, a high voltage signal can flow along a path R1 from the first heavily doped region 32 into the buried layer 24 through the conductive region 60 with relatively low resistivity. The high voltage signal can further flow along a path R2 in the buried layer and the path R3 on a side of the first trench structure 40 to reach a gate channel (not shown) under the gate 38. It should be noted that in the present invention the conductive region has a relatively low resistivity so that turn-on resistance (Ron) in the device is relatively low compared to that in conventional semiconductor devices. Therefore, the power consumption of the device is effectively minimized. It should be noted that, the flow sequence of the high voltage signal is not limited to the sequence stated above (from the path R1 to the path R3). That is to say, high voltage signal may first laterally flow from the well 30 toward the first trench structure 40 and then flow along the paths R3, R2 and R1 in sequence. Finally, the high voltage signal may be transmitted into the first heavily doped region 32.

Figure 3:
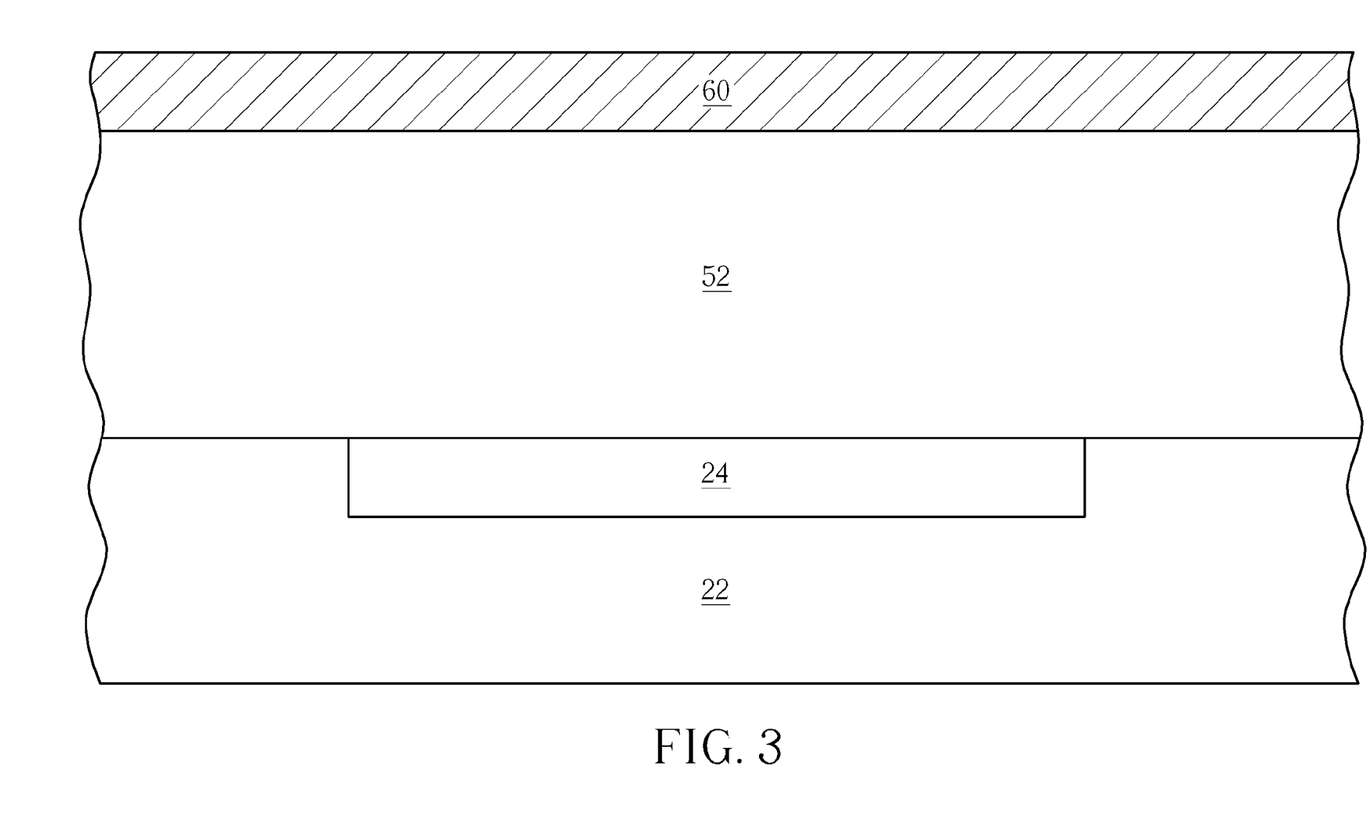
Figure 4:
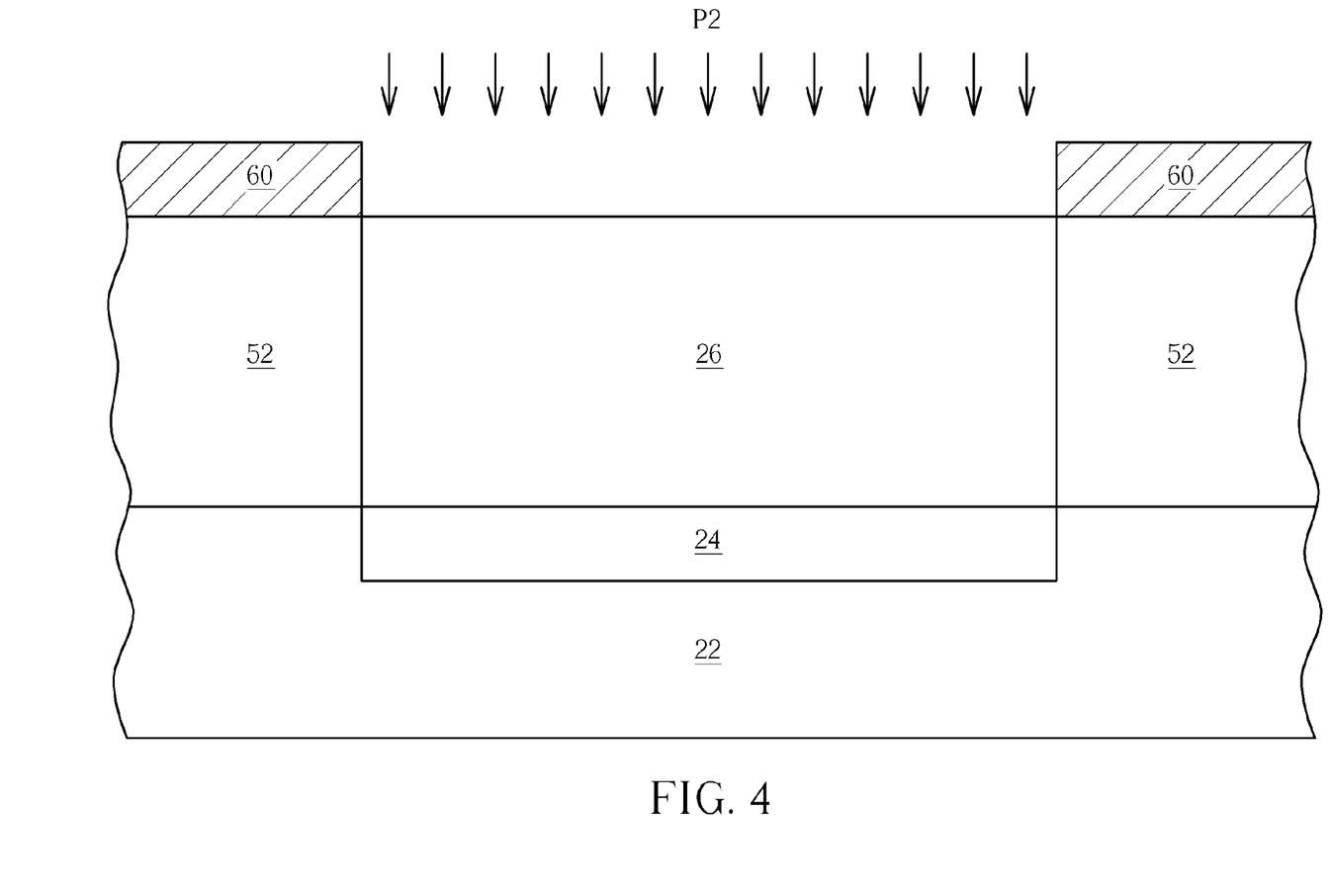

The present invention also provides a method for fabricating a semiconductor device, and more specifically, a method for fabricating the semiconductor device having trench structures with different depths surrounding the gate. Please refer to FIG. 2 to FIG. 10. FIG. 2 to FIG. 10 illustrate a method for fabricating a semiconductor device according to a preferred exemplary embodiment of the present invention. As shown in FIG. 2, a semiconductor substrate 22 is provided, and an ion implantation process P1 is performed to form a buried layer 24 having the first conductivity type in the semiconductor substrate 22. The semiconductor substrate 22 may be a substrate composed of GaAs, silicon on insulator (SOI) layer, epitaxial layer, SiGe layer or other semiconductor materials, and the buried layer 24 could be an N+ type buried layer. Then, as shown in FIG. 3, after the formation of the buried layer 24, an epitaxial layer 52 having the second conductivity type can be further formed on the buried layer 24 to thicken the semiconductor substrate 22 for example; a selective epitaxial growth (SEG) process is performed to form the epitaxial layer 52 having a thickness around 5 μm on the buried layer 24. A mask layer 60 is formed to cover the entire epitaxial layer 52. Subsequently, as shown in FIG. 4, patterning the mask layer 60 and then performing an ion implantation process P2 under the coverage of the patterned mask layer 60, as a consequence, a deep well 26 having a first conductivity type is formed in the epitaxial layer 52, that is, the deep well 26 is disposed in the semiconductor substrate 22 on the buried layer 24. It is worth noting that it is not necessary to align the lateral side of the deep well 26 with that of the buried layer 24.

Figure 5:
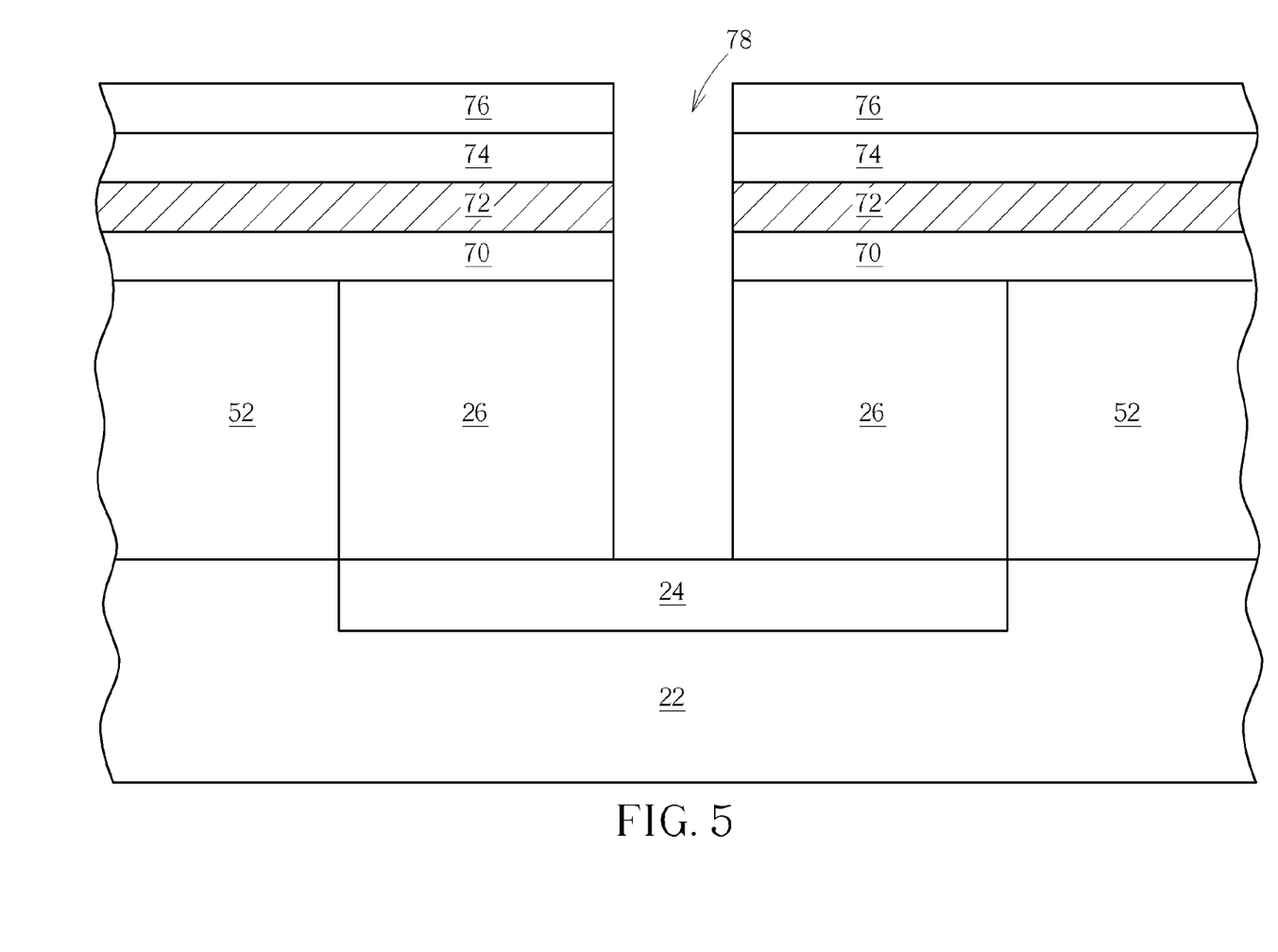

After forming the deep well 26 and removing the patterned hard mask layer 60, fabrication processes can go to a next stage as shown in FIG. 5. Another mask layer is formed on the epitaxial layer 52 and then patterned through suitable processes. The above processes may include forming a multi-layered structure, such as a pad oxide layer 70, a pad nitride layer 72 and a photoresist layer 76 stacked structure, and then patterned it through photolithographic and etching processes. According to different requirements, another oxide layer 74, such as a TEOS layer, may be formed between the pad nitride layer 72 and the photoresist layer 76. In order to transfer a pattern of the photoresist layer 76 into the deep well 26, at least an etching process is carried out, so that an opening 78 is formed inside the deep well 26 and exposes the underlying buried layer 24. It is worth noting that, the bottom of the opening 78 is preferably aligned with the surface of the buried layer 24, but is not limited thereto. For example, the bottom of the opening 78 may be deep into the buried layer 24.

Figure 6:
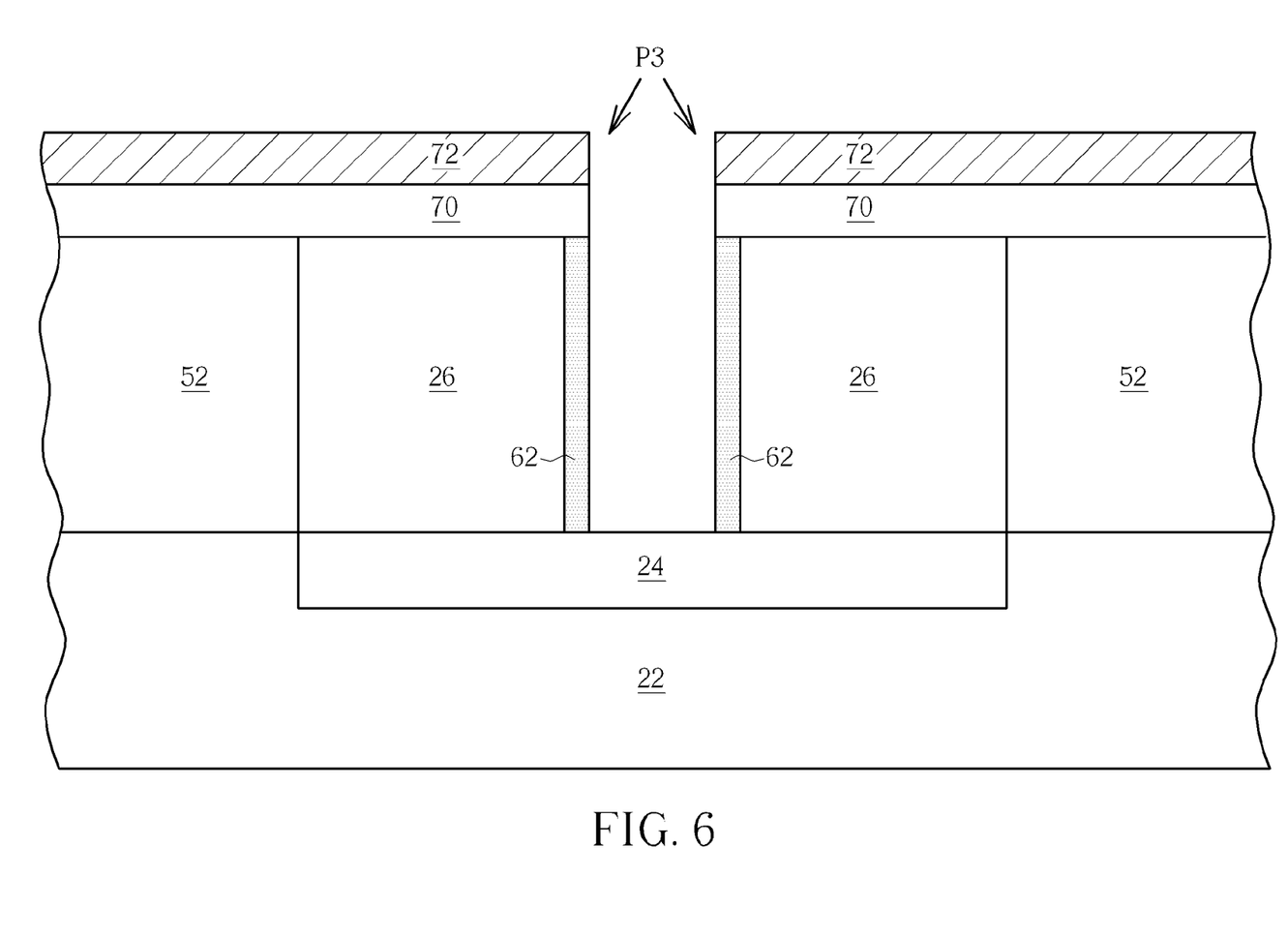
Figure 7:
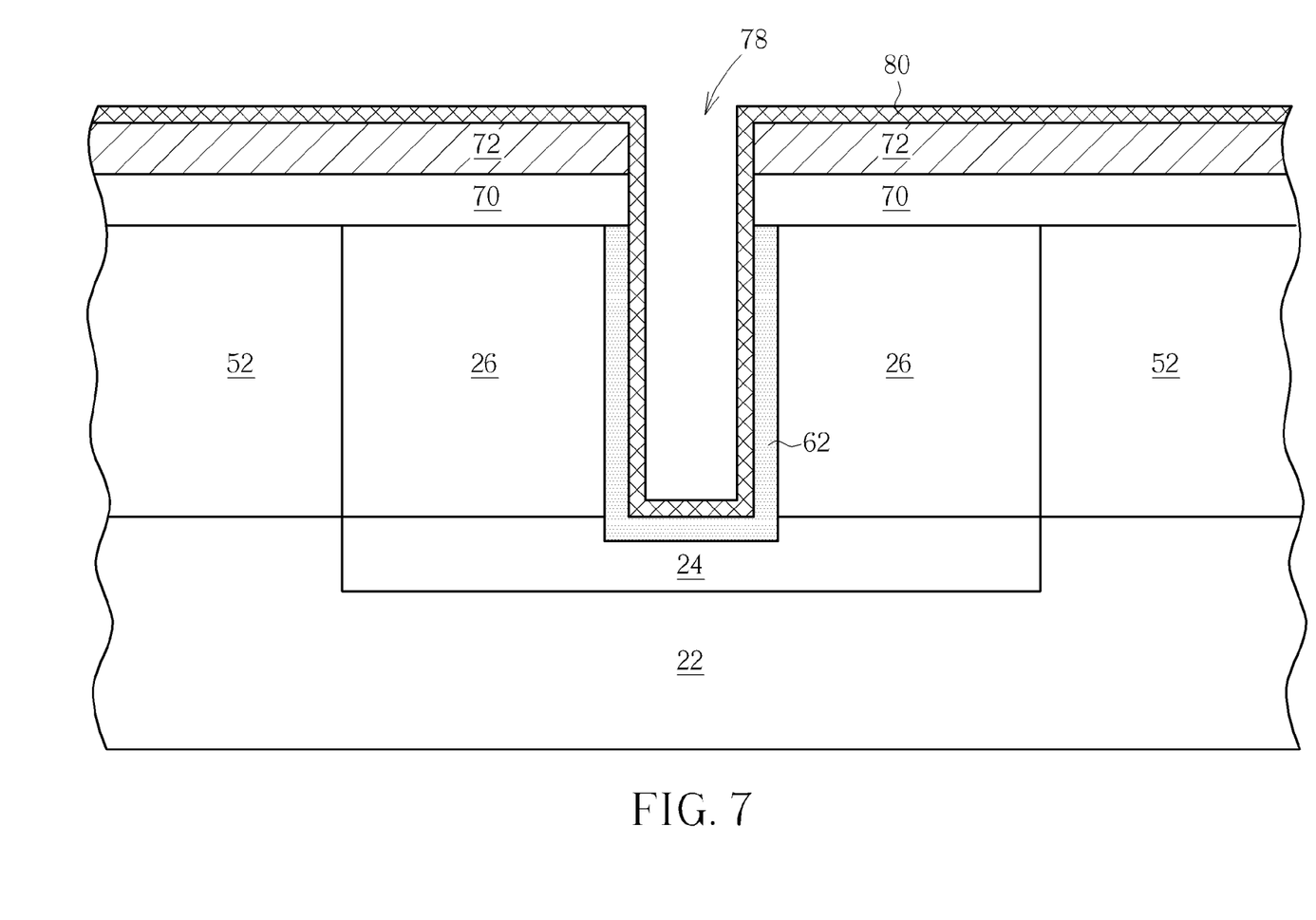

Please refer to FIG. 6, a doping process P3 is carried out to form a conductive region 62 having the first conductivity on the sidewall of the opening 78. According to one embodiment of the invention, the doping process may include an ion implantation process, such as a tilt-angled ion implantation process. In this case, dopants with the first conductivity type can be implanted into the deep well 26 being exposed from the opening so that the conductive region 62 with relatively low resistivity is formed inside a portion of the deep well 26. Due to this reduced resistivity, the conductive region 62 may serve as a main carrier path.

Moreover, the doping process P3 described above is not limited to the ion implantation process; it could be replaced with other suitable doping processes, such as solid-phase diffusion (SPD) processes and vapor-phase diffusion (VPD) processes, but is not limited thereto. In the solid-phase diffusion part, first, a dopant source region (not shown) with the first conductivity type may fill up the opening through a deposition process. Subsequently, a drive-in process is performed so that the dopants may diffuse from the dopant source region into the deep well 26. The composition of the dopant source region may include epitaxial silicon (or monocrystalline silicon), polycrystalline silicon, amorphous silicon, or arsenic silicate glass (ASG), but is not limited thereto. The drive-in process may include a rapid thermal process (RTP), a spike thermal annealing, a laser thermal annealing (LTA) or a laser spike annealing, (LSA), but not limited thereto. However, in the vapor-phase diffusion part, dopants with the first conductivity type may directly diffuse into the deep well 26 in gas phase, without dopant source region.

Furthermore, the formation of the conductive region 62 may also be conducted through a silicidation process. That is to say, the composition of the conductive region 62 may include metal silicide. The corresponding detailed processes are described as follows. According to a second embodiment of the invention shown in FIG. 7, a metal layer 80 is formed on the surface of the pad nitride 72 and the opening 78 first. Then, a silicidation thermal process, such as a rapid thermal process, is performed in an inert gas environment, like nitrogen gas environment for example. In this case, metal atoms inside the metal layer 80 can diffuse into the deep well 26 and form the conductive region 62. Finally, the unreacted metal layer 80 is removed completely. In addition, the metal layer 60 includes titanium, nickel, platinum, cobalt, chromium, tungsten or one of their alloys. It should be noted that, the composition of the conductive region 62 corresponds to the composition of the metal layer 80. For example, if the composition of the metal layer 80 is nickel, the composition of the conductive region 62 is nickel silicide (NiSi). Further, according to another embodiment of the invention, after the formation of the metal layer 80, an etching-back process is then performed to remove most of the metal layer 80 on the surface of the pad nitride 72 and the opening 78. As a result, a metal spacer (not shown) is formed on the sidewall of the opening 78, which can be deemed as the conductive region 62. According to another embodiment, the conductive region 62 may replaced by a conductive epitaxial layer. Since the function and the location of the conductive epitaxial layer are similar to those described in the above embodiments, their detailed description is therefore omitted for the sake of brevity.

Accordingly, in some embodiments illustrated above, the conductive region 62 is preferably a structure along the sidewall of the opening 78, such as a three dimensional ring-shaped structure. In the other embodiments, the conductive region 62 may further be located on an interface between the opening 78 and the buried layer 24. For example, as show in FIG. 7, a portion of the conductive region 62 is disposed on the surface of the buried layer 24.

Figure 8:
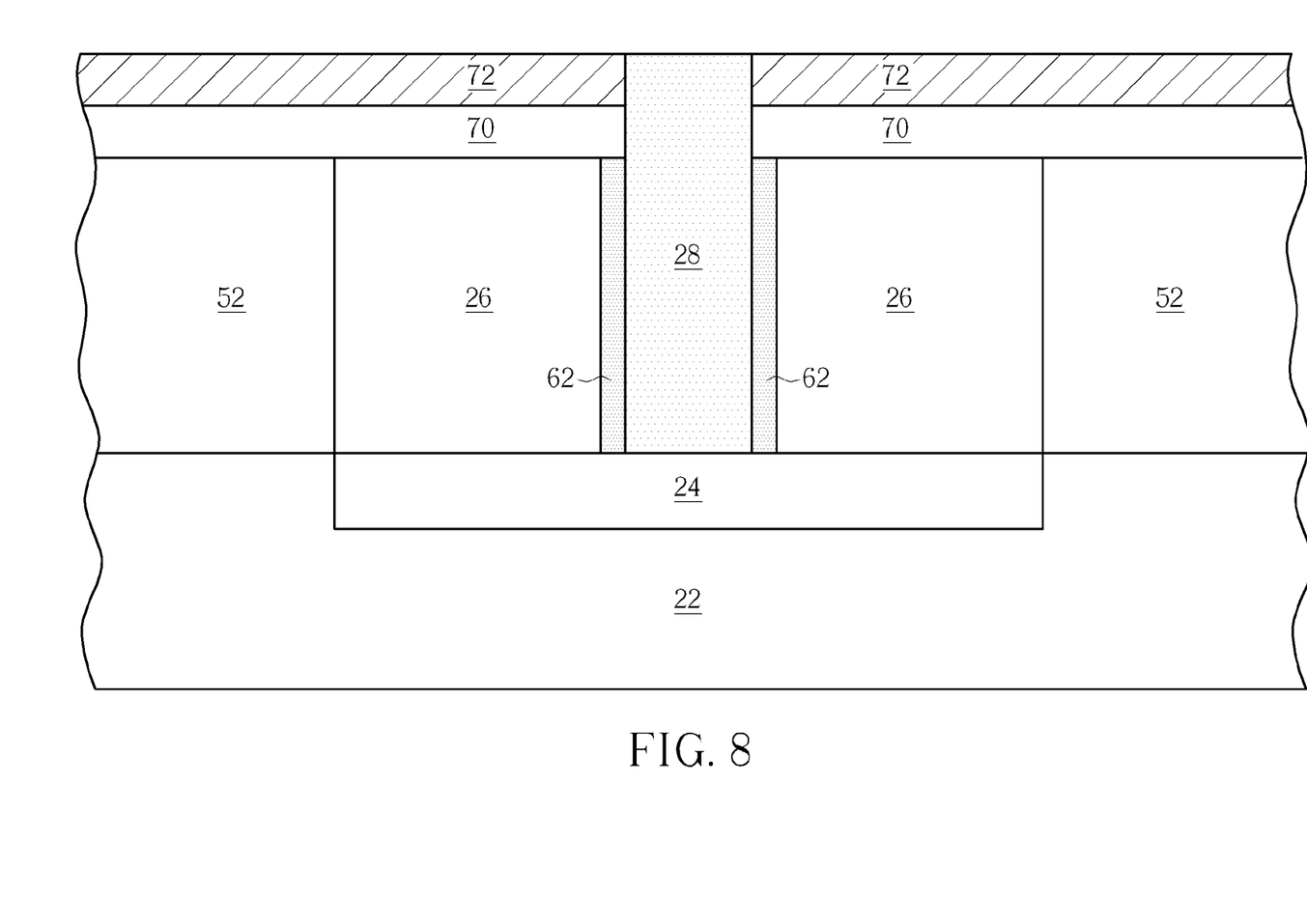

Finally, as shown in FIG. 8, a semiconductor material with the first conductivity type, such as polysilicon, is filled into the opening through at least a deposition and a planarization process. As a result, a first doped region 28 is formed in the deep well 26. Additionally, according to various embodiments, the bottom of the first doped region 28 may directly contact the buried layer 24 or directly contact the conductive region (not shown).

It should be noted that, whether the composition of the conductive region 62 is dopants with the first conductivity type or metal silicide, there must be a concentration gradient within the conductive region 62. For example, if there is a dopant concentration gradient within the conductive region 62, dopant concentration will decrease progressively from an interface between the conductive region 62 and the first doped region 28 towards an interface between the conductive region 62 and the deep well 26; in another case, if there is a metal silicide concentration gradient within the conductive region 62, metal silicide concentration will decrease progressively from an interface between the conductive region 62 and the first doped region 28 towards an interface between the conductive region 62 and the deep well 26.

Figure 9:
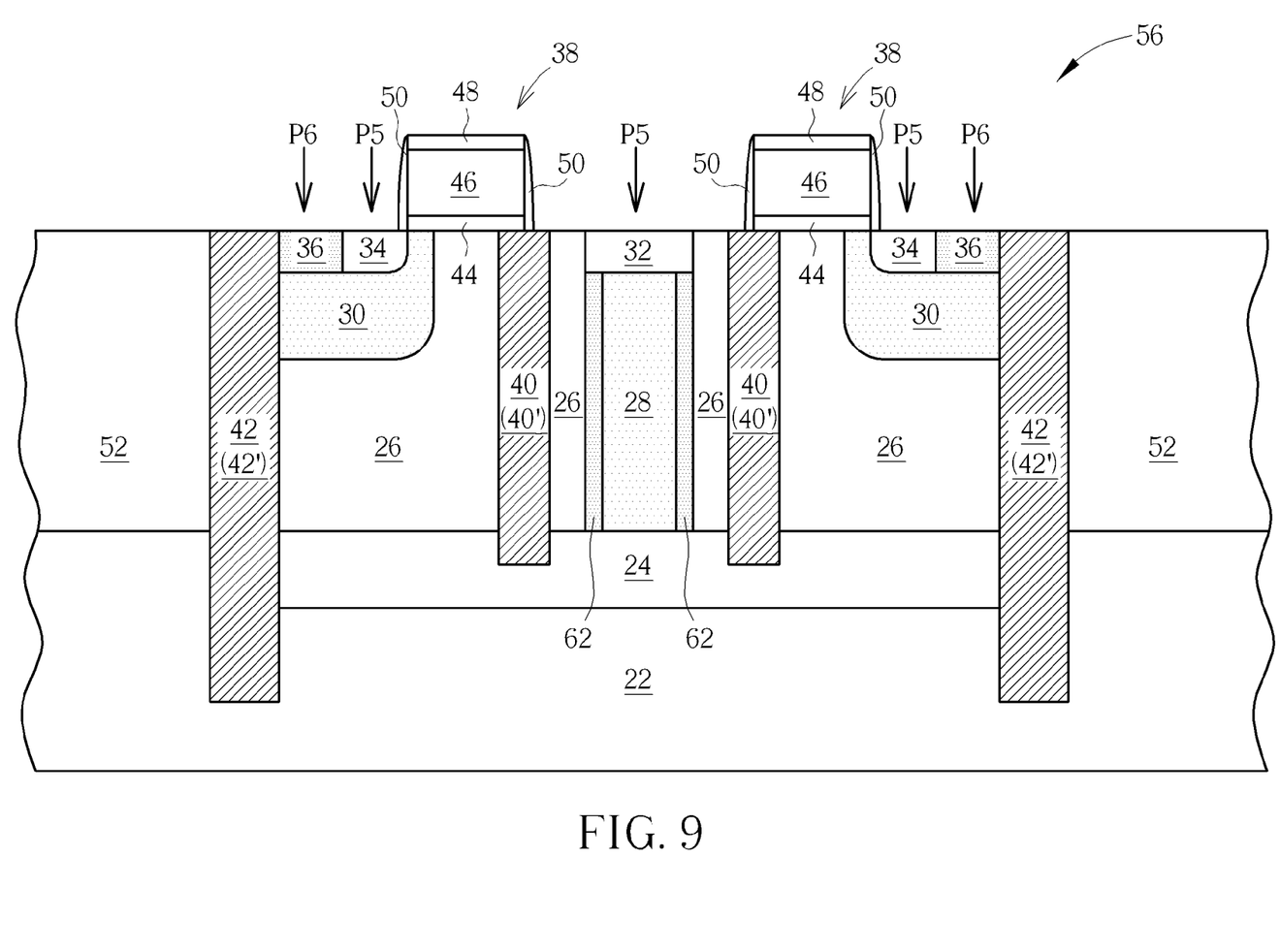

Subsequently, trench isolation processes are carried out by using the pad oxide 70 and the pad nitride 72 as mask layer or, optionally, by depositing another layer above the pad oxide 70 and the pad nitride 72 as a mask. Next, as shown in FIG. 9, the first trench 40' and the second trench 42' are filled with insulating material to form a first trench structure 40 and a second trench structure 42. The method for forming the first trench structure 40 and the second trench structure 42 includes the following steps. First, a thermal oxidation process is selectively performed to oxidize the semiconductor substrate 22 exposed by the first trench 40' and the second trench 42' in order to form an oxide layer (not shown) respectively covering the bottom and the inner sides of the first trench 40' and the bottom and the inner sides of the second trench 42'. The first trench 40' and the second trench 42' are not totally filled with the insulating material. Then, a dielectric layer (not shown) made of oxide is formed to fill the first trench 40' and the second trench 42' through a chemical vapor deposition (CVD) process including high density plasma density CVD (HDPCVD) process, sub atmosphere CVD (SACVD) process, or spin on dielectric (SOD) process. Furthermore, a chemical mechanical polishing (CMP) process is performed to remove the additional oxide layer, the additional dielectric layer and the remaining patterned mask to complete the formation of the first trench structure 40 and the second trench structure 42 as shown in FIG. 9. Additionally, the first trench structure 40 and the second trench structure 42 may be formed separately or, in another case, formed simultaneously by giving them with different opening size. As a result, a width of the first trench structure 40 is substantially smaller than that of the second trench structure 42. The depth of the second trench structure 42 is substantially larger than a depth of the buried layer 24. In other words, the bottom side of the second trench structure 42 is under the bottom side of the buried layer 24 and, preferably, deeper than the buried layer 24.

An ion implantation process is performed to form a well 30 in the deep well 26 at the other side of the first trench structure 40 opposite to the first doped region 28, and the well 30 has a second conductivity type and preferably does not contact the buried layer 24. In this exemplary embodiment, the first trench structure 40 could be located between the well 30 and the first doped region 28, the first trench structure 40 may surround the first doped region 28, and the second trench structure 42 may surround the deep well 26, the first trench structure 40 and the first doped region 28. The ion implantation process P4 includes the following steps. First, dopants having the second conductivity type are implemented into a part of the deep well 26, then a thermal process is performed to drive-in the dopants. A dopant concentration of the well 30 is substantially equal to a dopant concentration of the deep well 26, but smaller than a dopant concentration of the buried layer 24, but not limited thereto.

Finally, at least a gate 38 is formed on the semiconductor substrate 22. The gate 38 includes a gate dielectric layer 44, a gate conductive layer 46, a cap layer 48 and a spacer 50. The fabricating processes of the gate are known to those skilled in the art, therefore the details are omitted herein for brevity. The gate 38 overlaps a part of the deep well 26 between the first trench structure 40 and the second trench structure 42, and a part of the first trench structure 40. Then, at least a first heavily doped region 32 having the first conductivity type is formed in the first doped region 28 and at least a second heavily doped region 34 having the first conductivity type is formed in the well 30. The method of fabricating the first heavily doped region 32 and the second heavily doped region 34 includes the following steps. The gate 38 and a patterned mask (not shown) are used as a mask to perform an ion implantation process P5 to respectively form the first heavily doped region 32 and the second heavily doped region 34 in the semiconductor substrate 22 at both sides of the gate 38. A dopant concentration of the first heavily doped region 32 and a dopant concentration of the second heavily doped region 34 are substantially higher than the dopant concentration of the deep well 26, the dopant concentration of the first doped region 28 and the dopant concentration of the well 30. The first trench structure 40 is between the first heavily doped region 32 and the second heavily doped region 34, and the second trench structure 42 is in the semiconductor substrate 22 at the other side of the gate 38, opposite to the first trench structure 40. Furthermore, an ion implantation process P6 is further carried out to form at least a third heavily doped region 36 in the well 30. The third heavily doped region 36 has the same second conductivity type as the well 30. In this exemplary embodiment, the first heavily doped region 32 may be a communal drain, the second heavily doped region 34 may be a source, and the third heavily doped region 36 may be used to adjust the electric potential of the well 30. Accordingly, a semiconductor device 56 such as LDMOS transistor device is completed.

Figure 10:
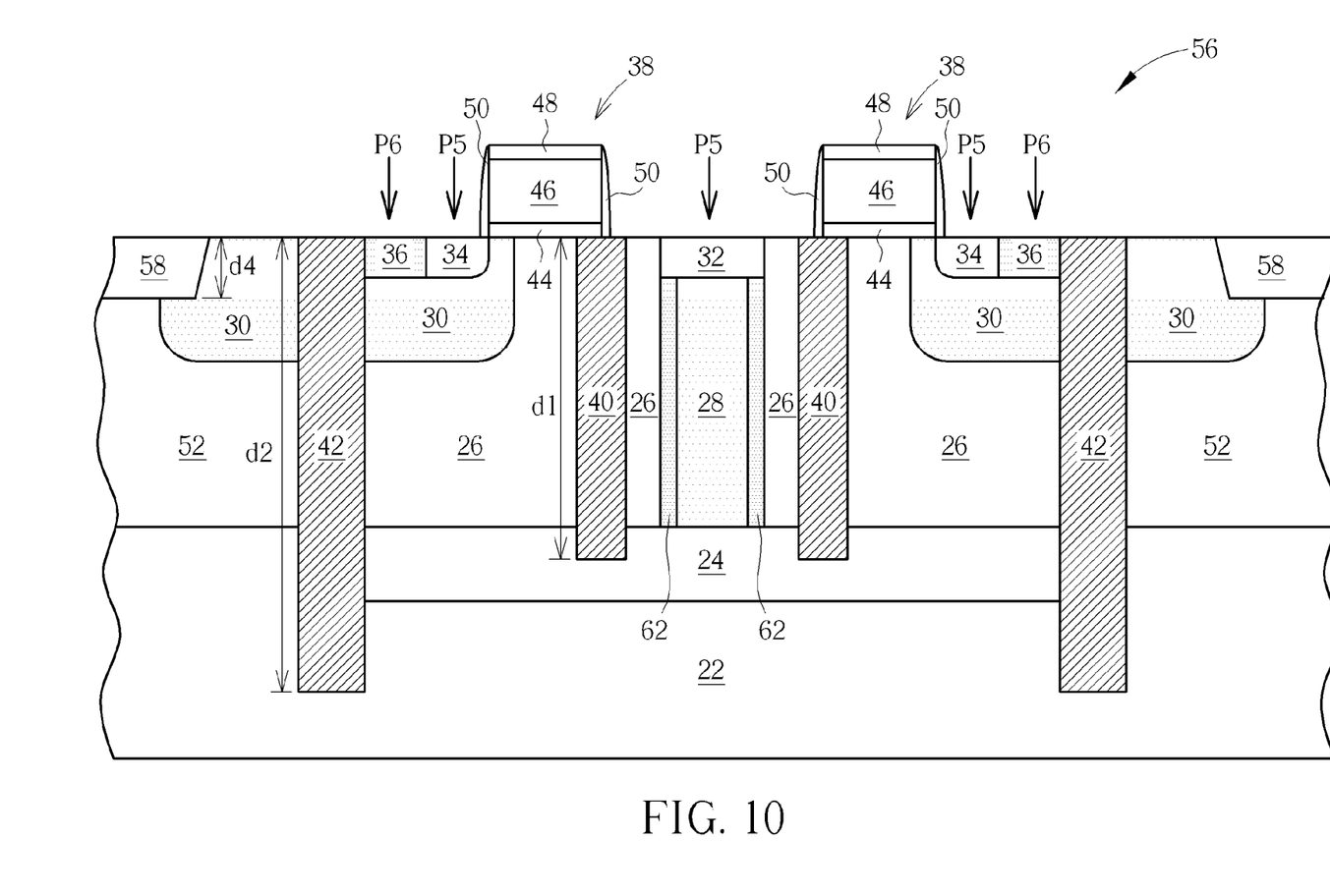

In another exemplary embodiment, as shown in FIG. 10, the semiconductor device 56 may further include a shallow trench structure 58 around to provide additional insulating effects, that is, to avoid the mutual disturbance between the semiconductor device 56 and other semiconductor devices (not shown) disposed in the semiconductor substrate. The fabricating process of the shallow trench structure 58 could be integrated into the fabricating process of the first trench structure 40 and the second trench structure 42 to save the cost, but not limited thereto. A depth d4 of the shallow trench structure 58 is substantially smaller than the depth d1 of the first trench structure 40 or the depth d2 of the second trench structure 42.

To summarize, the present invention provides a semiconductor transistor including not only a first trench structure and a second trench structure but also a conductive region with a 3D ring-shaped structure. The low-resistivity conductive region is located on the interface of the deep well and the first doped region. Since the resistivity of the conductive region is smaller than that of the adjacent deep well and first doped region, carriers can flow through the first doped region and the buried region easily. As a result, the on-resistance and the power consumption of the transistor are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a semiconductor substrate;
a buried layer disposed in the semiconductor substrate;
a deep well having a first conductivity type disposed in the semiconductor substrate, wherein the deep well is disposed on the buried layer;
a first doped region having the first conductivity type disposed in the deep well, wherein the first doped region contacts the buried layer;
a conductive region having the first conductivity type surrounding and being adjacent to the first doped region, wherein the conductive region has a dopant concentration higher than the first doped region;
a first heavily doped region having the first conductivity type and disposed in the first doped region;
a well having a second conductivity type disposed in the deep well;
a second heavily doped region having the first conductivity type disposed in the well;

a gate disposed on the semiconductor substrate between the first heavily doped region and the second heavily doped region;

a first trench structure consisting of insulating material and disposed in the semiconductor substrate at one side of the gate, wherein the first trench structure contacts the buried layer and partially overlaps the gate, wherein the conductive region is disposed between the first trench structure and the first doped region; and a second trench structure disposed in the semiconductor substrate at the other side of the gate opposite to the first trench structure, wherein a depth of the second trench structure is deeper than a depth of the buried layer.

2. The semiconductor device according to claim 1, wherein the conductive region comprises a three dimensional ring-shaped structure.

3. The semiconductor device according to claim 1, wherein the conductive region has a dopant concentration gradient and the dopant concentration decreases progressively from an interface between the conductive region and the first doped region towards an interface between the conductive region and the deep well.

4. The semiconductor device according to claim 1, wherein the first trench structure is disposed between the first doped region and the well.

5. The semiconductor device according to claim 1, wherein the semiconductor substrate further comprises an epitaxial layer and the deep well is disposed in the epitaxial layer.

6. The semiconductor device according to claim 1, wherein a width of the first trench structure is smaller than a width of the second trench structure.

7. The semiconductor device according to claim 1, wherein the first conductivity type is one of n-type or p-type, and the second conductivity type is the other one.

* * * * *